US010553277B2

(12) United States Patent
Lee (10) Patent No.: US 10,553,277 B2
(45) Date of Patent: Feb. 4, 2020

(54) CROSS POINT ARRAY TYPE PHASE CHANGE MEMORY DEVICE AND METHOD OF DRIVING THE SAME

(71) Applicant: SK hynix Inc., Icheon-si, Gyeonggi-do (KR)

(72) Inventor: In Soo Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/815,186

(22) Filed: Nov. 16, 2017

(65) Prior Publication Data

US 2018/0144794 A1 May 24, 2018

(30) Foreign Application Priority Data

Nov. 21, 2016 (KR) .................. 10-2016-0154985

(51) Int. Cl.
*G11C 13/00* (2006.01)
*G06F 11/10* (2006.01)
*G11C 29/42* (2006.01)
*G11C 16/26* (2006.01)
*G11C 29/52* (2006.01)

(52) U.S. Cl.
CPC ........ *G11C 13/004* (2013.01); *G06F 11/1048* (2013.01); *G11C 13/0004* (2013.01); *G11C 29/42* (2013.01); *G11C 16/26* (2013.01); *G11C 29/52* (2013.01); *G11C 2013/0045* (2013.01); *G11C 2013/0054* (2013.01)

(58) Field of Classification Search
None
See application file for complete search history.

(56) References Cited

U.S. PATENT DOCUMENTS

| 9,691,463 B1 * | 6/2017 | Worledge ............ G11C 11/1675 |
| 2005/0047201 A1 * | 3/2005 | Perner ..................... G11C 11/15 365/158 |
| 2009/0303785 A1 * | 12/2009 | Hwang .................. G11C 5/147 365/163 |
| 2011/0280084 A1 * | 11/2011 | Radke ..................... G11C 11/26 365/185.21 |
| 2018/0081753 A1 * | 3/2018 | Khayat ............. H03M 13/3723 |

FOREIGN PATENT DOCUMENTS

KR      1020160014473 A    2/2016

* cited by examiner

*Primary Examiner* — James G Norman
(74) *Attorney, Agent, or Firm* — William Park & Associates Ltd.

(57) ABSTRACT

A phase change memory device may include a cross point array and a sensing circuit block. The cross point array may include a plurality of word lines, a plurality of bit lines and phase change memory cells. The word lines and the bit lines may intersect each other. The phase change memory cells are positioned at intersection points between the word lines and the bit lines. The sensing circuit block reads data in the phase change memory cells. The sensing circuit block may include a first sensing unit and a second sensing unit. The first sensing unit senses the data using a first voltage. The second sensing unit senses the data using a second voltage, which may be higher than a threshold voltage of the phase change memory cell, when the data in the phase change memory cell read by the first sensing unit is determined to be abnormal.

16 Claims, 5 Drawing Sheets

CROSS POINT ARRAY TYPE PHASE CHANGE MEMORY DEVICE AND METHOD OF DRIVING THE SAME

CROSS-REFERENCES TO RELATED APPLICATION

The present application claims priority under 35 U.S.C. § 119(a) to Korean application number 10-2016-0154985, filed on Nov. 21, 2016, in the Korean Intellectual Property Office, which is incorporated herein by reference in its entirety.

BACKGROUND

1. Technical Field

Various embodiments generally relate to a phase change memory device and a method of driving the same, more particularly, to a cross point array type phase change memory device and a method of driving the cross point array type phase change memory device.

2. Related Art

A phase change memory device may use a chalcogenide material as a storage medium. The chalcogenide material in the phase change memory device may be converted into an amorphous phase and a crystalline phase by applying a current or a voltage. The amorphous phase may be a reset phase and the crystalline phase may be a set phase.

The phase change memory device may include a plurality of word lines, a plurality of bit lines overlapped with the word lines and a selecting element and a storing element arranged at intersection points between the word lines and the bit lines.

The storing element may write data. A read current may be applied to the storing element to read the data.

However, when applying the read current, the read current may include an unintended transient current so that information in a memory cell may be changed. Further, disturbance may be generated in an adjacent line.

SUMMARY

According to an embodiment, there may be provided a phase change memory device. The phase change memory device may include a cross point array and a sensing circuit block. The cross point array may include a plurality of word lines, a plurality of bit lines and phase change memory cells. The word lines and the bit lines may be intersect each other. The phase change memory cells may be positioned at intersection points between the word lines and the bit lines. The sensing circuit block may be configured to read data in the phase change memory cells. The sensing circuit block may include a first sensing unit and a second sensing unit. The first sensing unit may be configured to sense the data using a first voltage. The second sensing unit may be configured to sense the data using a second voltage, which may be higher than a threshold voltage of the phase change memory cell, when the data in the phase change memory cell read by the first sensing unit may be determined to be abnormal.

According to an embodiment, there may be provided a method of driving a phase change memory device. In the method of driving the phase change memory device, the phase change memory device may include a cross point array. The cross point array may include a plurality of word lines, a plurality of bit lines, and phase change memory cells. The word lines and the bit lines may intersect each other. The phase change memory cells may be positioned at intersection points between the word lines and the bit lines. Data in the phase change memory cells may be sensed using a first voltage, which may be no more than a threshold voltage of the phase change memory cell, by a read command. The sensed data may be determined to be normal or not. When the sensed data is determined to be abnormal, the data in the phase change memory cell may be sensed using a second voltage higher than the threshold voltage.

According to an embodiment, there may be provided a memory device. The memory device includes a memory cell array including a plurality of memory cells. The memory device includes a first sense circuit configured to sense data of a selected memory cell using a first voltage less than a threshold voltage of the memory cell and a second sense circuit configured to sense the data of the selected memory cell using a second voltage higher than the threshold voltage if the sensed data of the selected memory cell has an error. Further, the memory device includes a controller configured to decide operations of the first sense circuit and the second sense circuit. The controller is configured to provide a rewrite command to the selected memory cell if the data of the selected memory cell is changed by the second sense circuit.

DETAILED DESCRIPTION

Various example embodiments will be described hereinafter with reference to the accompanying drawings, in which some examples of the embodiments are illustrated. The embodiments may, however, be embodied in many different forms and should not be construed as limited to the examples of embodiments set forth herein. Rather, these example embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to," or "coupled to" another element or layer, the element can be directly on, connected or coupled to the other element or layer or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present disclosure.

Spatially relative terms, such as "under," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

Figure 1:
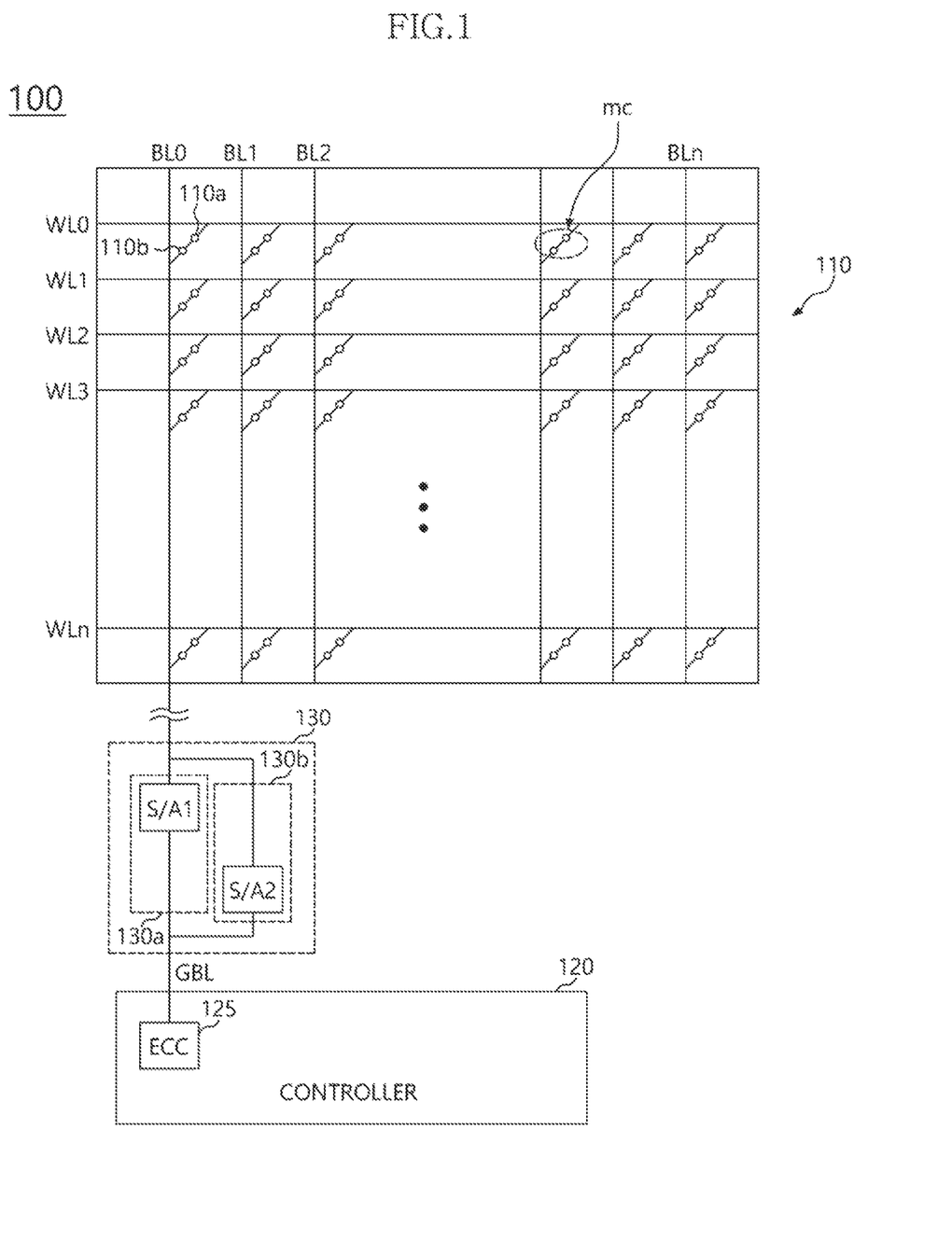
FIG. 1 is a block diagram illustrating a phase change memory device in accordance with example embodiments.

FIG. 1 is a block diagram illustrating a phase change memory device in accordance with example embodiments.

Referring to FIG. 1, a phase change memory device 100 may include a memory cell array 110, a controller 120, and a sensing circuit block 130.

The memory cell array 110, which may be a cross point cell array or a cross point array type phase change memory device, may include a plurality of word lines WL0-WLn and a plurality of bit lines BL0-BLn. The bit lines BL0-BLn may be overlapped with the word lines WL0-WLn to intersect with each other. A phase change memory cell mc may be arranged at each intersection point between the word lines WL0-WLn and the bit lines BL0-BLn. The phase change memory cell mc may include an access element 110a and a storage element 110b. The access element 110a and the storage element 110b may include a lower electrode, a phase change layer, and an upper electrode. The phase change layer in the access element 110a may be different from the phase change layer in the storage element 110b.

The controller 120 may be configured to control the phase change memory device 100 by host commands to read or write data. The controller 120 may be configured to account for operational conditions and/or internal operations of the phase change memory device 100 to effectively manage the phase change memory device 100. The controller 120 may include an error correction code (ECC) block 125. The ECC block 125 may be configured to detect, determine and correct an error included in the data written or read in the phase change memory device 100.

The sensing circuit block 130 may be driven by commands received from the controller 120. For example, the sensing circuit block 130 may be connected to a global bit line GBL configured to globally control at least some of the bit lines BL0-BLn. The sensing circuit block 130 may include a first sensing unit 130a and a second sensing unit 130b.

The first sensing unit 130a may be configured to perform a data sensing operation such as reading and verifying data in the phase change memory cell mc using a first voltage V1 corresponding to a reference voltage VREF. The second sensing unit 130b may be configured to perform a data sensing operation such as reading and verifying data in the phase change memory cell mc using a second voltage V2. The first sensing unit 130a may include a sense amplifier circuit S/A1 and the second sensing unit 130b may include a sense amplifier circuit S/A2. The first sensing unit 130a and the second sensing unit 130b may be electrically connected between the ECC block 125 and the global bit line GBL.

Figure 2:
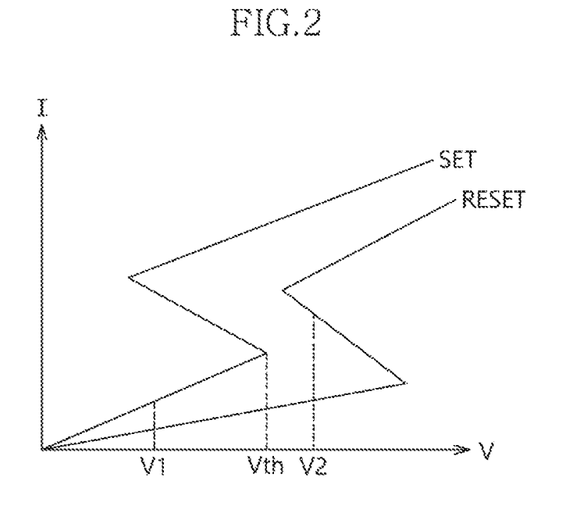
FIG. 2 is a graph showing current-voltage characteristics of a phase change memory device in accordance with example embodiments.

FIG. 2 is a graph showing current-voltage characteristics of a phase change memory device in accordance with example embodiments.

Referring to FIG. 2, the first voltage V1 may have a voltage level lower than a voltage at which the data may not be changed. The voltage may include a data storage voltage or a write voltage.

The second voltage V2 may be higher than the first voltage V1 and a threshold voltage Vth of the phase change memory cell mc. The threshold voltage Vth of the phase change memory cell mc may function to convert a resistance state of the phase change memory device 100 from a crystalline phase into amorphous phase and vice versa.

Figure 3:
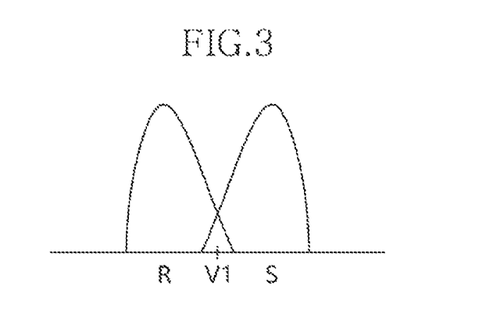
FIG. 3 is a schematic view illustrating a process for sensing data using a first voltage in FIG. 2.

For example, when the first voltage V1 of no more than the threshold voltage Vth is used to perform a read sensing, the read sensing may be stably performed. In contrast, as shown in FIG. 3, a read error may be generated due to a lack of a sensing margin.

Figure 4:
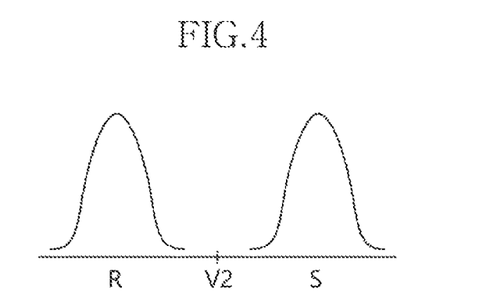
FIG. 4 is a schematic view illustrating a process for sensing data using a second voltage in FIG. 2.

When a read sensing is performed using the second voltage V2 of no less than the threshold voltage Vth, as shown in FIG. 4, the sensing margin may be sufficiently ensured. In contrast, a data level may be changed due to applying the second voltage V2 of no less than the threshold voltage Vth.

Figure 5:
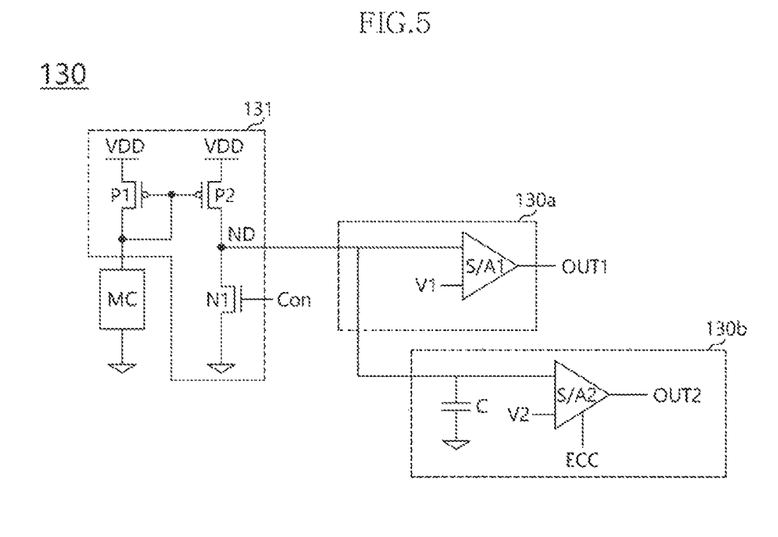
FIG. 5 is a circuit diagram illustrating a sensing circuit block in FIG. 1.

FIG. 5 is a circuit diagram illustrating a sensing circuit block of FIG. 1.

Referring to FIG. 5, the sensing circuit block 130 may include a reference current-generating unit 131, a first sensing unit 130a, and a second sensing unit 130b.

The reference current-generating unit 131 may include first and second PMOS transistors P1 and P2 and a control transistor N1. The first and second PMOS transistors P1 and P2 may be configured to constitute a current mirror. The control transistor N1 may be configured to control the first and second sensing units 130a and 130b.

The phase change memory cell mc may be electrically connected with the first PMOS transistor P1 of the reference current-generating unit 131. The second PMOS transistor P2 may copy a current inputted into the phase change memory cell mc to be read. The second PMOS transistor P2 may provide input node ND of the first and second sensing units 130a and 130b with a reference current which may be the input current of the phase change memory cell mc. The control transistor N1 may be driven in response to a control signal con. The control transistor N1 may control a current amount to selectively drive the first and second sensing units 130a and 130b.

As above, the first sensing unit 130a may include the sense amplifier circuit S/A1 configured to compare a voltage provided to the input node ND of the sense amplifier circuit S/A1 with the first voltage V1. The input node ND may correspond to an output node of the reference current-generating unit 131.

The second sensing unit 130b may include a capacitor C configured to be charged with the voltage of the input node ND which is provided from the reference current-generating unit 131, and the sense amplifier circuit S/A2 configured to compare the voltage in the capacitor C with the second voltage V2. Because a circuit of the second sensing unit 130b may commonly share a circuit of the first sensing unit 130a, the second sensing unit 130b does not increase an area of the sensing circuit block 130.

The controller 120 may control the first sensing unit 130a and the second sensing unit 130b of the sensing circuit block 130. If data of the phase memory cell mc is changed by a data sensing operation of the second sensing unit 130 using the second voltage V2 higher than the threshold voltage Vth, the controller 120 may output a command for re-writing a normal data to the phase memory cell mc including the changed data.

Figure 6:
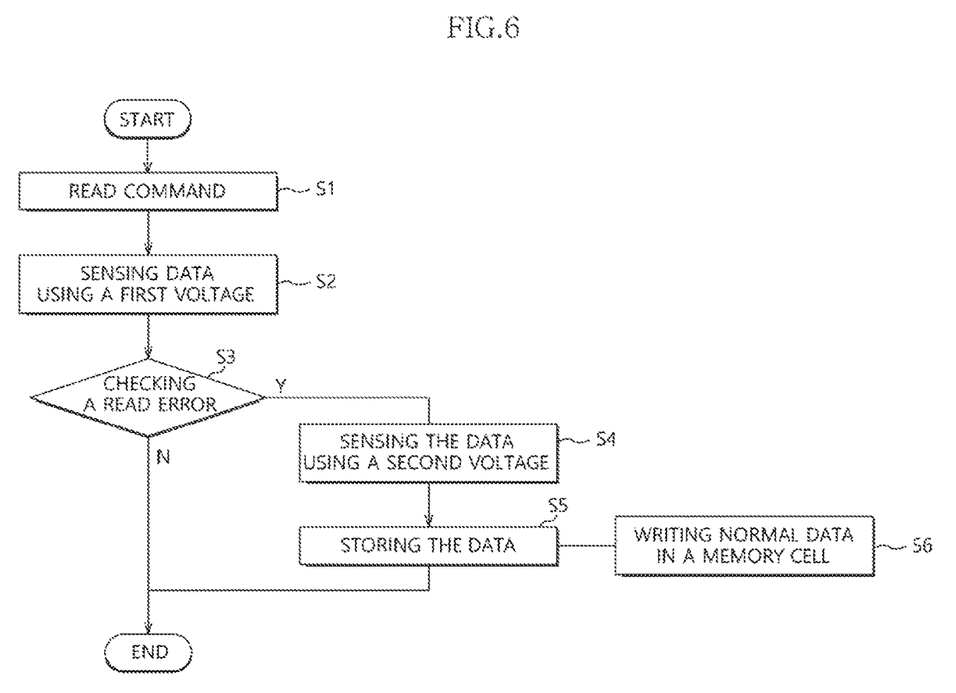
FIG. 6 is a flow chart illustrating a method of driving a phase change memory device in accordance with example embodiments.

FIG. 6 is a flow chart illustrating a method of driving a phase change memory device in accordance with example embodiments.

Referring to FIGS. 1 to 6, in step S1, a read command may be applied from the controller 120.

In step S2, the first sensing unit 130a, which may be connected with the global bit line GBL of the phase change memory cell mc to be read, may be driven by the read command. The data in the phase change memory cell mc may be sensed by the first voltage V1 which is less than or equal to the threshold voltage Vth in accordance with the read command, which may correspond to a normal read voltage, by the driving of the first sensing unit 130a.

In step S3, the ECC block 125 in the controller 120 may check whether a read error occurred by determining whether or not the data sensed by the first voltage V1 is normal. When the data sensed by the first voltage V1 is within a normal or correctable range by the ECC block 125, a read operation may be finished by operation of the first sensing unit 130a.

In contrast, when the ECC block 125 determines that the data sensed using the first voltage V1 is abnormal, in step S4, the controller 120 may drive the second sensing unit 130b. An additional data sensing may be performed on the phase change memory cell mc determined to include abnormal data as determined using the second voltage V2 of no less than the threshold voltage Vth in accordance with the driving of the second sensing unit 130b.

The capacitor C of the second sensing unit 130b may be configured to charge the transient current introduced into the phase change memory cell mc when the first sensing unit 130a is operated. The second sensing unit 130b may compare the voltage of the capacitor C with the second voltage V2 of no less than the threshold voltage Vth to sense the data with a sufficient margin. The error caused by the disturbance or the transient current may be determined by the additional operation of the second sensing unit 130b.

In step S5, the data sensed by the second sensing unit 130b using the second voltage V2 may be stored in the ECC block 125.

In step S6, if the data of the phase change memory cell mc is changed by the sensing operation S5 using the second voltage V2, normal data may be written in the phase change memory cell mc. In other words, the second sensing unit 130b may perform a data sensing operation using the second voltage V2 higher than the threshold voltage Vth of the phase change memory cell mc when an error is generated in data of the phase change memory cell mc read by the first sensing unit 130a. By the data sensing operation using the second voltage V2, the data of the phase change memory cell mc may be changed. If the data is changed, the controller 120 may output a write command for rewriting a normal data to the phase change memory cell mc. According to the write command, a write driver (not shown) which are electrically coupled to the memory cell array may provide the normal data to the phase change memory cell mc.

According to example embodiments, during the data reading operation, an additional data read operation may be performed on the phase change memory cell in which a data error may be generated due to the transient current in the read current using a voltage higher than the read voltage.

Figure 7:
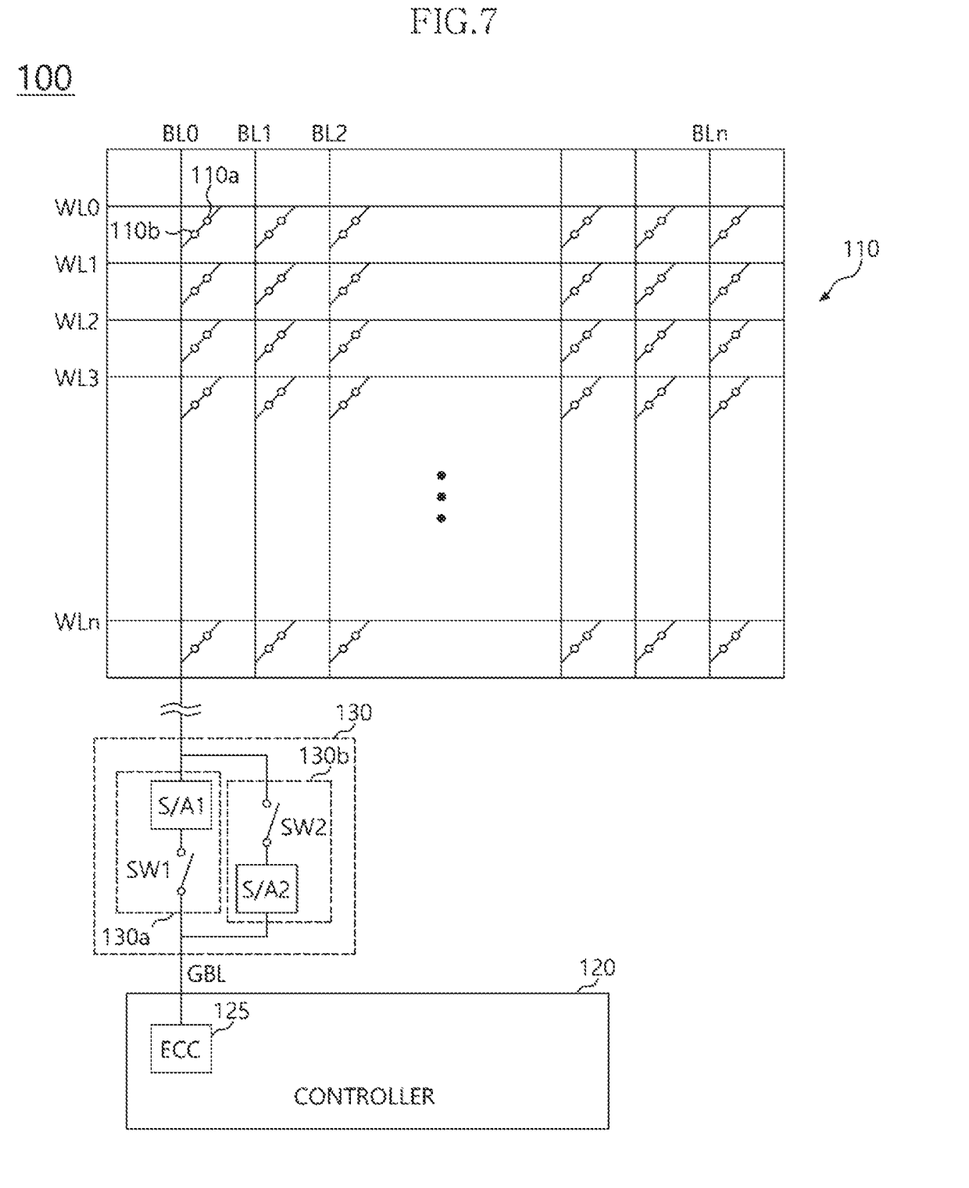
FIG. 7 is a block diagram illustrating a phase change memory device in accordance with example embodiments.

The present embodiment may not be restricted by the above-mentioned embodiments. For example, as shown in FIG. 7, switches SW1 and SW2 may be installed between the ECC block 125 and the first sensing unit 130a, and between the ECC block 125 and the second sensing unit 130b to stably perform the selective driving of the first and second sensing units 130a and 130b.

Figure 8:
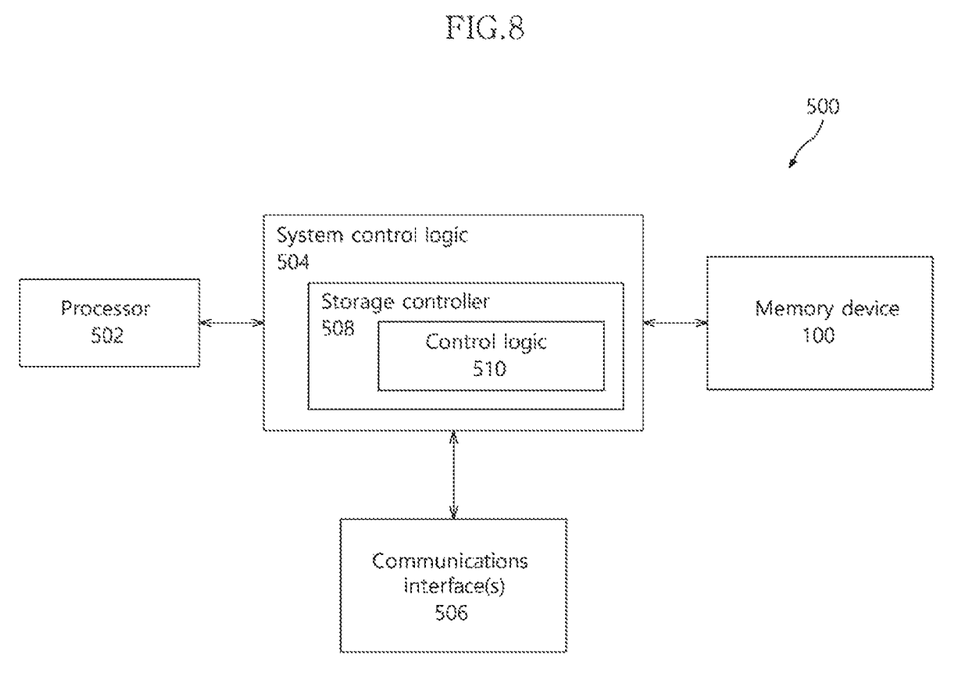
FIG. 8 is a block diagram illustrating a system in accordance with example embodiments.

FIG. 8 is a block diagram illustrating a system in accordance with example embodiments.

Referring to FIG. 8, a system 500 may include a system control logic 504, a memory device or the semiconductor integrated circuit device 100 and at least one communication interface 506. The system control logic 504 may be connected with at least one of processors 502. The semiconductor integrated circuit device 100 may be connected with the system control logic 504. The communication interface 506 may be connected with the system control logic 504.

The communication interface 506 may provide an interface for the system 500 configured to communicate with devices through at least one network. The communication interface 506 may include hardware and/or firmware. In example embodiments, the communication interface 506 may include a network adaptor, a wireless network adaptor, a telephone modem, and/or a wireless modem. The communication interface 506 may use at least one antenna for wireless communication.

At least one of the processors 502 may be packed with a logic for at least one controller of the system control logic 504. In example embodiments, the processor 502 may be packed with the logic for the controller of the system control logic 504 to form a system in package (SIP).

In example embodiments, at least one of the processors 502 may be arranged on a die in which the logic for the controller of the system control logic may be installed.

In example embodiments, at least one of the processors 502 may be arranged on the die in which the logic for the controller of the system control logic may be installed to form a system on chip (SOC).

In example embodiments, the system control logic 504 may include interface controllers configured to provide a device or a component communicating with at least one of the processors 502 and/or the system control logic 504 through interfaces.

In example embodiments, the system control logic 504 may include a storage controller 508 configured to provide the semiconductor integrated circuit device 100 with interfaces for controlling various access operations such as a set operation, a reset operation, a read operation, etc. The storage controller 508 may include a control logic 510 configured to control the semiconductor integrated circuit device 100. The control logic 510 may additionally generate various selection signals for controlling drivers, level shifters, global selectors, etc. When the control logic 510 is operated by at least one of the processors 502, the control logic 510 may include commands stored in a computer readable medium for performing the above-mentioned operations of the storage controller 508.

In example embodiments, the system 500 may include a desktop computing device, laptop computing device, a mobile computing device such as a smart phone, a tablet, etc. The system 500 may further include components and/or different architectures.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A phase change memory device comprising:
   a cross point cell array including a plurality of word lines, a plurality of bit lines arranged on the word lines to intersect with each other, and a phase change memory cell arranged at intersection points between the word lines and bit lines;
   a sensing circuit block configured to read data in the phase change memory cell, the sensing circuit block including:
   a first sensing unit for performing a data sensing operation using a first voltage at which the data is not changed, and
   a second sensing unit for performing a data sensing operation using a second voltage which changes the data of the phase change memory cell when an error is generated in the data in the phase change memory cell read by the first sensing unit; and
   a controller including an error correction code (ECC) block configured to determine whether the error is generated in the first sensing unit and correct the error when the error is within a correctable range,
   wherein the controller is configured to provide a rewrite command to the selected memory cell when the data of the phase change memory cell is changed by the second sensing unit,
   wherein the second sensing unit is operated when the data read by the first sensing unit cannot be recovered by the ECC block.

2. The phase change memory device of claim 1, wherein the first sensing unit and the second sensing unit are electrically connected between a global bit line, electrically coupled to the controller, and the bit lines.

3. The phase change memory device of claim 2, further comprising:
   a first switch connected between the controller and the first sensing unit; and
   a second switch connected between the first sensing unit and the second sensing unit.

4. The phase change memory device of claim 3, wherein the first and second switches are configured to perform selective driving of the first and second sensing units.

5. The phase change memory device of claim 1, wherein the sensing circuit block further comprises a reference current-generating unit configured to copy a current inputted into the phase change memory cell to be read and to provide the first and second sensing units.

6. The phase change memory device of claim 5, wherein the first sensing unit comprises a sense amplifier circuit configured to compare the first voltage with a voltage provided to the reference current-generating unit.

7. The phase change memory device of claim 1, wherein the second sensing unit comprises:
   a capacitor configured to charge a voltage provided from a reference current-generating member; and
   a sense amplifier circuit configured to compare the second voltage with the voltage charged in the capacitor.

8. The phase change memory device of claim 7, wherein the capacitor is configured to charge a transient current into the phase change memory cell when the first sensing unit is operated.

9. The phase change memory device of claim 5, wherein the reference current-generating unit further comprises a control transistor configured to be driven in response to a control signal to selectively drive the first and second sensing units.

10. A method of driving a cross point array type phase change memory device, the cross point array type phase change memory device including a plurality of word lines, a plurality of bit lines intersected with the word lines, and a phase change memory cell arranged at intersection points between the word lines and bit lines, the method comprising:
    first sensing data in the phase change memory cell using a first voltage of no more than a threshold voltage in accordance with a read command, wherein a state of the sensed data is not changed by the first sensing;
    determining whether or not the sensed data is normal and whether or not the sensed data is recovered by an ECC block;
    second sensing the data in the phase change memory cell using a second voltage higher than the threshold voltage, when the sensed data is not normal and the firstly sensed data is not recovered by the ECC block, wherein the state of the data is changed by the second sensing, and
    re-writing normal data in the phase change memory cell, when the state of the data in the phase change memory cell is changed by the second sensing.

11. The method of claim 10, further comprising storing the data sensed by the second voltage in an error correction code (ECC) block.

12. The method of claim 10, further comprising finishing the sensing of the data in the phase change memory cell when the sensed data is normal and the sensed data is recovered by the ECC block.

13. A memory device comprising:
a memory cell array including a plurality of memory cells;
a first sense circuit configured to sense data of a selected memory cell using a first voltage less than a threshold voltage of the memory cell;
a second sense circuit configured to sense the data of the selected memory cell using a second voltage higher than the threshold voltage if the sensed data of the selected memory cell has an error; and
a controller configured to decide operations of the first sense circuit and the second sense circuit, the controller including an error correction code (ECC) block configured to determine whether the error is generated in the first sense circuit,
wherein the controller is configured to provide a rewrite command to the selected memory cell if the data of the selected memory cell is changed by the second sense circuit,
wherein the second sensing circuit is operated when the data sensed by the first sensing unit cannot be recovered by the ECC block.

14. The memory device of claim 13, further comprising a reference current-generating unit configured to copy a current inputted into the memory cell to be read and to provide the first and second sense circuits with a reference current.

15. The memory device of claim 13, wherein the first sense circuit comprises a sense amplifier circuit configured to compare the first voltage with a voltage provided to the reference current-generating unit.

16. The memory device of claim 15, wherein the second sense circuit comprises:
a capacitor configured to charge a voltage provided from the reference current-generating member; and
a sense amplifier circuit configured to compare the second voltage with the voltage in the capacitor.

* * * * *